United States Patent
Steyrer et al.

(10) Patent No.: US 11,492,464 B2
(45) Date of Patent: Nov. 8, 2022

(54) LIGHT-CURABLE COMPOSITION

(71) Applicant: Technische Universitaet Wien, Vienna (AT)

(72) Inventors: Bernhard Steyrer, Tulln (AT); Robert Liska, Schieinbach (AT); Jürgen Stampfl, Vienna (AT)

(73) Assignee: TECHNISCHE UNIVERSITÄT WIEN, Vienna (AT)

( * ) Notice: Subject to any disclaimer, the term of this patent is extended or adjusted under 35 U.S.C. 154(b) by 360 days.

(21) Appl. No.: 16/607,992

(22) PCT Filed: Apr. 27, 2018

(86) PCT No.: PCT/EP2018/060890
§ 371 (c)(1),
(2) Date: Oct. 24, 2019

(87) PCT Pub. No.: WO2018/197677
PCT Pub. Date: Nov. 1, 2018

(65) Prior Publication Data
US 2021/0032441 A1 Feb. 4, 2021

(30) Foreign Application Priority Data
Apr. 28, 2017 (EP) .................... 17168663

(51) Int. Cl.
*C08L 9/00* (2006.01)
*B33Y 70/00* (2020.01)
(52) U.S. Cl.
CPC ............... *C08L 9/00* (2013.01); *B33Y 70/00* (2014.12)
(58) Field of Classification Search
CPC .................... C08L 9/00; B33Y 70/00

USPC ........................................................ 523/206
See application file for complete search history.

(56) References Cited

FOREIGN PATENT DOCUMENTS

| | | | |
|---|---|---|---|
| DE | 10150256 A1 | 7/2003 | |
| EP | 1371695 A1 | 12/2003 | |
| JP | 2006285178 A | 10/2006 | |
| WO | 03099947 A1 | 12/2003 | |
| WO | 2008125202 A1 | 10/2008 | |
| WO | WO-2008125202 A1 * | 10/2008 | ........... C08G 18/798 |
| WO | 2014126830 A2 | 8/2014 | |
| WO | 2015074088 A2 | 5/2015 | |
| WO | 2015075094 A1 | 5/2015 | |
| WO | 2016078838 A1 | 5/2016 | |

OTHER PUBLICATIONS

International Preliminary Report on Patentability dated Oct. 29, 2019 in International Application No. PCT/EP2018/060890.
International Search Report dated Jul. 11, 2018 in International Application No. PCT/EP2018/060890.
Swetly et al., "Capabilities of additive manufacturing technologies (AMT) in the validation of the automotive cockpit," RTejournal—Forum für Rapid Technologie, 10 pages (2014).

* cited by examiner

*Primary Examiner* — Deve V Hall
(74) *Attorney, Agent, or Firm* — Panitch Schwarze Belisario & Nadel LLP

(57) ABSTRACT

A light-curable composition is provided which may be used as a photopolymerizable material in an additive manufacturing process. The additive manufacturing process involves heating the light-curable composition which has a viscosity at 20° C. of at least 20 Pa·s. The light-curable composition includes a photopolymerizable matrix material, at least one thermoplastic polymer dissolved therein, and at least one photoinitiator. Polycaprolactone or a derivative thereof is used as the dissolved thermoplastic polymer.

18 Claims, 2 Drawing Sheets

LIGHT-CURABLE COMPOSITION

CROSS-REFERENCE TO RELATED APPLICATION

Figure 1:
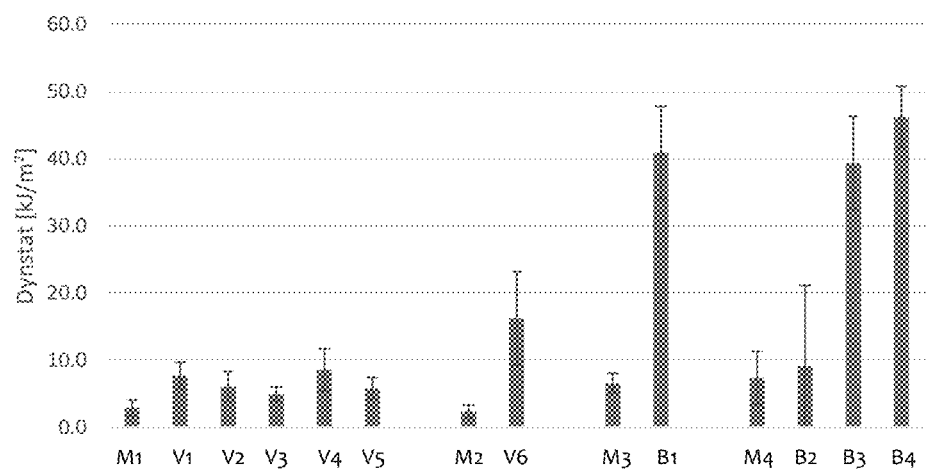

This application is a Section 371 of International Application No. PCT/EP2018/060890, filed Apr. 27, 2018, which was published in the German language on Nov. 1, 2018, under International Publication No. WO 2018/197677 A1, which claims priority to European Patent Application No. 17168663.7, filed on Apr. 28, 2017, the disclosures of which are incorporated herein by reference in their entireties.

The present invention relates to a light-curable composition for use as photopolymerizable material in a generative manufacturing process.

STATE OF THE ART

Like, for example, 3D-printing methods, lithography-based generative manufacturing methods such as stereolithography are traditionally mainly used for producing prototypes and functional models ("rapid prototyping"). Technical progress results in focus increasingly shifting to product applications, including transparent aligners or hearing aid shells. Mechanical and thermal properties of printed materials are decisive for their potential applications. Materials currently available for generative manufacturing, however, do not yet have the same mechanical properties as conventional manufacturing materials (see, for example, Swetly, T.; Stampfl, J.; Kempf, G. and Hucke, R.-M. "Capabilities of additive manufacturing technologies (AMT) in the validation of the automotive cockpit", RTejournal—Forum für Rapid Technologie 2014(1)).

These materials (resins) for generative manufacturing are based on reactive components that are exposed to light to be cured. Radical (e.g., for acrylates) and cationic (e.g., for expoxy) polymerization are often used for this purpose. Special photoinitiators are added to the resin; they will change their state after having been exposed to light and thus trigger the polymerization of the reactive components.

Various methods, e.g., stereolithography, digital light processing and multi-jet modelling, are available for generative manufacturing of objects made of these resins. In all these methods, the resins are cured layer by layer to thus create a three-dimensional object. Usually, such methods require low-viscosity resins, e.g. from 20 to 40 mPa·s (see Gibson, I.; Rosen, W.; Stucker, B. et al., "Additive manufacturing technologies", Vol. 238, Springer Verlag (2010)).

In order to improve the mechanical properties, in particular impact resistance and elongation, of thus cured products, it is required to reduce the crosslinking density and to increase the molecular weight of the monomers. This, however, results in an increase of the viscosity and a higher melting point of the uncured resins, which is why it used to be impossible, until recently, to cure them by means of generative manufacturing methods.

New developments have, however, made it possible to process higher-viscosity resins. WO 2015/075094 A1 and WO 2016/078838 A1, for example, disclose stereolithography devices in which the layers of polymerizable materials that are to be cured sequentially may be heated, which allows for high-viscosity resins to be processed. WO 2015/074088 A2 discloses photopolymerizable compositions that have a viscosity at room temperature of at least 20 Pa·s and have to be heated to at least 30° C. during curing. 20 Pa·s correspond approximately to the viscosity of ethylene glycol or viscous honey, while butter having a viscosity of approximately 30 Pa·s is hardly flowable anymore.

Problems relating to the mechanical properties of the cured products, such as 3D-printed parts, however, still remain unsolved. Such products, for example, have insufficient impact resistance and stretchability, are too brittle and absorb too much water from the ambient air.

WO 2008/125202 A1 discloses polyurethane systems that can be cured by radiation and thermal crosslinking and their use for the manufacturing of holographic media. The polyurethane compositions comprise A) polyisocyanate, B) polyols comprising at least one poly(c-caprolactone) polyester polyol, C) compounds containing groups that, when exposed to actinic radiation, react in polymerization reactions with ethylenically unsaturated compounds, D) optionally radical stabilizers, and E) photoinitiators. The thus obtained polycaprolactone polyols preferably have molecular weights of 500 to 2,000 g/mol and serve as "building blocks for matrix polymers", i.e., they react in polyaddition reactions with polyisocyanates to yield the desired polyurethanes. Against this backdrop, the object of the present invention was to provide improved light-curable compositions for generative manufacturing methods.

DISCLOSURE OF THE INVENTION

The invention achieves the above object by providing the use of a light-curable composition as a photopolymerizable material in a generative manufacturing process by heating the composition which has a viscosity at 20° C. of at least 20 Pa·s and comprises the following components:
  a photopolymerizable matrix material,
  at least one thermoplastic polymer dissolved therein and
  at least one photoinitiator;
characterized in that a polycaprolactone or a derivative thereof is used as said dissolved thermoplastic polymer.

Surprisingly, it turned out that polycaprolactone is significantly superior to other high-molecular thermoplastics as far as mechanical properties of cured products produced in a generative manufacturing process are concerned, as clearly shown in the exemplary embodiments described below.

"A thermoplastic polymer dissolved in matrix material" herein generally means that the thermoplastic polymer is soluble in the matrix material, but is essentially unreactive during photopolymerization, i.e. essentially does not react with the matrix material and does not participate in the polymerization process, either. Only in very exceptional cases, a small proportion of the thermoplastic polymer, e.g., not more than 5 wt %, preferably not more than 3 wt %, more preferably not more than 1 wt %, of the thermoplastic polymer, may be derivatized with polymerizable moieties, which, however, is not preferred according to the present invention, as explained in more detail below.

In preferred embodiments of the invention, the polycaprolactone or a derivative thereof has a number average molecular weight $M_n$ of at least 25,000 g/mol, more preferably of at least 50,000 g/mol, most preferably of at least 70,000 g/mol, and is dissolved in the photopolymerizable matrix material at a ratio of 2 to 30 wt %, more preferably of 5 to 15 wt %, most preferably of approx. 10 wt %, which further improves the mechanical properties. Moreover, unmodified polycaprolactone is preferably used as dissolved thermoplastic polymer, although, in some cases, a certain proportion of the polycaprolactone may, for example, be modified with polymerizable groups, dye moieties, photoinitiator and thermal initiator moieties, and the like. In addition, copolymers of caprolactone, e.g., with lactide, having suitable properties may be used according to the present invention. Those skilled in the art will appreciate that most polycaprolactone derivatives are expected to have the same advantages as polycaprolactone itself as long as their respective degree of derivatization does not exceed a certain threshold.

According to the present invention, the photopolymerizable matrix material further preferably comprises a, preferably monofunctional, reactive diluent and at least one di- or higher functional crosslinker to provide for a sufficient solubility of the high-molecular polycaprolactone (derivative) and guarantee good mechanical properties of the cured product.

The at least one reactive diluent preferably accounts for 30 to 80 wt % and the at least one crosslinker preferably accounts for 70 to 20 wt % of the photopolymerizable matrix material, the content of the reactive diluent and that of the crosslinker being particularly preferably equal, or the content of reactive diluent being higher. This depends, among other things, on the crosslinking density and thus on the functionalities of the two matrix components. The at least one reactive diluent preferably has a viscosity at 20° C. of not more than 0.1 Pa·s to provide for a good viscosity when combined with the crosslinker and the dissolved polycaprolactone (derivative).

(Meth)acrylates are preferred as both reactive diluents and crosslinkers, as they are available in a wide range of molecular weights and functionalities and well explored, additionally offering good solubility for the polycaprolactone, thus providing the light-curable composition with thermal stability. The matrix has been composed in a way that the boiling points and the decomposition temperatures of the individual components are significantly higher than the processing temperature in a generative manufacturing process. Examples for monofunctional reactive diluents include isobornyl(meth)acrylate, dicyclopentadienyl(meth)acrylate and (meth)acryloyl morpholine.

In preferred embodiments, an oligomer, preferably one having terminal polymerizable moieties and a number average molecular weight $M_n$ of at least 400 g/mol, which may also amount to several thousand and up to 5,000, 10,000 or even 20,000 g/mol, is used in order to prevent the formation of an excessively high crosslinking density. Examples of difunctional (meth)acrylate crosslinkers include polyethylene glycol dimethacrylate, ethoxylated bisphenol A di(meth)acrylate, aliphatic polyesterurethane acrylate (e.g., Bomar BR-741) or methacrylate (e.g., Bomar XR-741 MS).

In further preferred embodiments, the composition has a viscosity at 20° C. of at least 50 Pa·s, more preferably of at least 80 Pa·s and most preferably of at least 100 Pa·s, i.e. is not only in a highly viscous liquid state, but even in a solid state at room temperature, which is beneficial for the composition's storability before its use in generative manufacturing processes.

Additionally, the light-curable composition may also comprise at least one further component selected from thermal initiators, dyes, fillers and modifiers, as commonly used in the fields of generative manufacturing and 3D printing.

EXAMPLES

Figure 2:
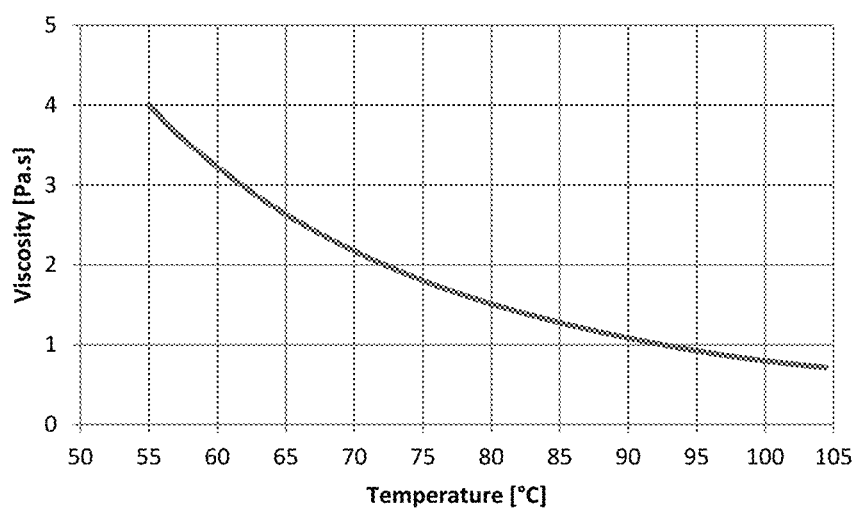

The present invention will be described below referring to specific exemplary embodiments and comparative examples as well as to the appended drawings that show the following:

FIG. 1 shows the results of an impact resistance test to which various photopolymers according to the invention and photopolymers produced in comparative examples were subjected; and FIG. 2 shows the development of the viscosity of a composition for use according to Example 5 of the present invention.

Examples 1 to 4, Comparative Examples 1 to 6

Compositions for the use according to the invention were produced with the proportions of components listed in Table 1 on the next page; 0.5 phr ("parts per hundred rubber", i.e., parts per 100 parts by weight of the matrix material) of Ivocerin, a photoinitiator available from Ivoclar Vivadent, were added to each of them.

15 wt % of the respective soluble thermoplastic or polycaprolactone were added to each of the compositions of all Comparative Examples and the composition of Example 1 that comprised the matrices 1 to 3, while only 10 wt % of polycaprolactone were added to each of the compositions of the invention of Examples 2 to 4 that contained matrix 4 (in all cases based on 100 wt % of the matrix and the thermoplastic taken together).

TABLE 1

| Example | Reactive diluent | crosslinker | thermoplastic |
| --- | --- | --- | --- |
| Matrix 1, M1 | 66.7% IBMA [1] | 33.3% SR834 [2] | — |
| Comparative Example 1, V1 | " | " | 15% RB810 [3] |
| Comparative Example 2, V2 | " | " | 15% RB830 [4] |
| Comparative Example 3, V3 | " | " | 15% SBR BL [5] |
| Comparative Example 4, V4 | " | " | 15% SBR SL [6] |
| Comparative Example 5, V5 | " | " | 15% SBR SE [7] |
| Matrix 2, M2 | 90% HEMA [8] | 10% SR348L [9] | — |
| Comparative Example 6, V6 | " | " | 15% TPU [10] |
| Matrix 3, M3 | 70% IBMA | 30% EO(30)BPA-DMA [11] | — |
| Example 1, B1 | " | " | 15% PCL 80 [12] |
| Matrix 4, M4 | 50% IBMA | 30% EO(30)BPA-DMA 20% XR741 [13] | — |
| Example 2, B2 | " | 30% EO(30)BPA-DMA 20% XR741 [13] | 10% PCL 25 [14] |
| Example 3, B3 | " | 30% EO(30)BPA-DMA 20% XR741 [13] | 10% PCL 50 [15] |

TABLE 1-continued

| Example | Reactive diluent | crosslinker | thermoplastic |
|---------|------------------|-------------|---------------|
| Example 4, B4 | " | 30% EO(30)BPA-DMA<br>20% XR741 [13] | 10% PCL 80 |

[1] IBMA: isobornyl methacrylate from Sigma Aldrich
[2] SR834: tricyclodecane dimethanol dimethacrylate from Sartomer
[3] RB810: syndiotactic 1,2-polybutadiene from JSR, 90% 1,2-bounds, Mn 120,000 g/mol
[4] RB830: syndiotactic 1,2-polybutadiene from JSR, 93% 1,2-bounds, Mn 120,000 g/mol
[5] SBR BL: styrene butadiene copolymer from Lanxess, Buna BL 30-4548, 48% styrene, 30% in block form
[6] SBR SL: styrene butadiene copolymer from Lanxess, Buna SL 4525-0, 25% styrene, obtained by solution polymerization
[7] SBR SE: styrene butadiene copolymer from Lanxess, Buna SE 1502, 23.5% styrene, obtained by emulsion polymerization
[8] HEMA: hydroxyethyl methacrylate from Sigma Aldrich
[9] SR348L: ethoxylated (2) bisphenol A dimethacrylate from Sartomer
[10] TPU: thermoplastic polyurethane from Covestro, Desmopan DP 85085A, Mn 160,000 g/mol
[11] EO(30)BPA-DMA: ethoxylated (30) bisphenol A dimethacrylate from Sigma Aldrich, Mn 1,700 g/mol
[12] PCL 80: polycaprolactone from Perstorp, Capa 6800, Mn 80,000 g/mol
[13] XR741: difunctional aliphatic polyesterurethane methacrylate from Dymax, Bomar XR-741MS
[14] PCL 25: polycaprolactone from Perstorp, Capa 6250, Mn 25,000 g/mol
[15] PCL 50: polycaprolactone from Perstorp, Capa 6506, Mn 50,000 g/mol To simulate a generative manufacturing process, the composition was cast into moulds at a temperature of 80° C. and immediately exposed for 500 sec using an Uvitron Intelliray 600 UV chamber operated at full capacity and thus cured. The samples were demoulded, turned around by 180° and exposed a second time for 500 sec. The sample body was then polished to a width of 4 mm using grit 1000 abrasive paper and conditioned according to ISO 291 for at least 88 h at 23° C. and 50% humidity. The sample body of matrix M2 and of Comparative Example 6 were conditioned for 14 days. After that, impact resistance was tested according to DIN 53435, the results being shown in FIG. 1.

The figure clearly shows that most of the soluble thermoplastics of the Comparative Examples were not able to achieve a significant improvement in impact resistance. Only the thermoplastic polyurethane of Comparative Example 6 did significantly increase the impact resistance of matrix material 3. This thermoplastic, however, had a number average molecular weight $M_n$ of 160,000 g/mol and was contained at a proportion of 15 wt %.

The polycaprolactone in Example 1, by way of comparison, that was also contained at a proportion of 15 wt % increased the impact resistance of matrix material 3 to a similar extent, although its number average molecular weight $M_n$ only amounted to 80,000 g/mol.

In the compositions of Examples 2 to 4, polycaprolactone was only contained at a proportion of 10 wt %, which is why the polycaprolactone "PCL 25" in Example 2 having a number average molecular weight $M_n$ of 25,000 g/mol only resulted in a minor improvement in the impact resistance of matrix material 4. The caprolactones of Examples 3 and 4, on the other hand, having molecular weights $M_n$ of 50,000 and 80,000 g/mol, respectively, resulted in a significant improvement in the impact resistance of the matrix that did not comprise any thermoplastic.

Comparison of Water Absorption

As the other soluble thermoplastics from the Comparative Examples had already proved hardly promising, only the sample bodies of Comparative Example 6 (V6) comprising a thermoplastic polyurethane and of Example 4 (B4) comprising polycaprolactone having a molecular weight of 80,000 g/mol were included in a test examining their water absorption. In this test, the two sample bodies were stored at 100% humidity for 8 days, after which the weight of V6 was found to have increased by 17.0%, while that of B4 had remained almost the same. Even after B4 had been immersed in water for 28 days, a weight increase of only 2.9% was observed, which confirms that, in terms of water absorption, the composition of Example 4 that contains polycaprolactone was clearly superior to that of Comparative Example 6 that comprised polyurethane as the thermoplastic and significantly higher polar matrix components, which are indispensable for dissolving polyurethane.

Example 5

The polycaprolactone "PCL 80" having a number average molecular weight $M_n$ of 80,000 g/mol that had achieved the best results until then was used in a 3D print experiment that was identical to 3D printing processes in practice. The following compositions were produced, both the reactive diluent and the crosslinker components of the matrix were supplied comprising MEHQ as polymerization inhibitor.

TABLE 2

| Example | reactive diluent | crosslinker | thermoplastic | additives |
|---------|------------------|-------------|---------------|-----------|
| Matrix 5 | 45% IBMA [1]<br>150 ppm MEHQ [2] | 27% EO(30)BPA-DMA [3]<br>18% XR741 [4]<br>200 ppm MEHQ | — | |
| Example 5 | 45% IBMA [1]<br>150 ppm MEHQ [2] | 27% EO(30)BPA-DMA [3]<br>18% XR741 [4]<br>200 ppm MEHQ | 10% PCL 80 [5] | 0.15 phr Ivocerin<br>0.5 phr ABCN [6]<br>0.075 phr SY [7] |

[1] IBMA: isobornyl methacrylate from Sigma Aldrich
[2] MEHQ: hydroquinone methylether (4-methoxyphenol), polymerization inhibitor from Sigma Aldrich
[3] EO(30)BPA-DMA: ethoxylated (30) bisphenol A dimethacrylate from Sigma Aldrich, Mn 1,700 g/mol
[4] XR741: difunctional aliphatic polyesterurethane methacrylate from Dymax, Bomar XR-741MS
[5] PCL 80: polycaprolactone from Perstorp, Capa 6800, Mn 80,000 g/mol
[6] ABCN: 1,1'-azobis(cyclohexane carbonitrile), a thermal initiator from Sigma Aldrich
[7] SY: Sudan Yellow 177, a dye from John Hogg 45 g of the two crosslinkers and 45 g of the reactive diluent were stirred for 30 min at 60° C. in a heated vessel equipped with a mechanical stirrer. After that, 10 g polycaprolactone were added, and the mixture was heated to 80° C., stirred for 6 hours at this temperature and then cooled to room temperature. The then solid mixture was removed from the vessel and transferred into a plastic cup where it was again heated to 80° C. and the photoinitiator (Ivocerin), the thermal initiator (ABCN) and the dye (SY) were added thereto. The mixture was homogenized for 10 min in a dual asymmetric centrifuge at 3,500 rpm.

The thus obtained composition was solid at room temperature and had an (uncorrected) melting point that was determined by means of DSC (heating rate: 10 K/min) of approx. 42.5° C. The viscosity was determined using a cone-plate viscosimeter having a diameter of 25 mm and a test gap of 49 μm, at a shear rate of 50 $s^{-1}$ and a heating rate of 0.05° C./s. The temperature-dependent development of the composition's viscosity is shown in FIG. 2.

The material was then processed using a heated DLP ("digital light processing") 3D printer at 60° C. In a tensile test according to ISO 527 with test bodies of type 5B, the thus printed test bodies had excellent tensile properties, i.e. an elongation at break of approx. 100%, and excellent thermo-mechanical properties (1 Hz and an amplitude of 20 μm) as regards dynamic modulus and damping (tangens delta) when tested on a Texas Instruments Dynamic Mechanical Analyzer DMA 2980 at −50 to 150° C.

The above examples of the present invention clearly show the advantages of the use of the invention of polycaprolactones as soluble thermoplastics in light-curable compositions for generative manufacturing processes and 3D printing.

The invention claimed is:

1. A light-curable composition configured to be used as a photopolymerizable material in an additive manufacturing process, the process comprising heating said light-curable composition which has a viscosity at 20° C. of at least 20 Pa·s, the light-curable composition comprising:
 a photopolymerizable matrix material,
 at least one thermoplastic polymer which essentially does not react with the photopolymerizable matrix material and does not participate in the polymerization process, and which is dissolved in the photopolymerizable matrix material, and
 at least one photoinitiator;
  wherein polycaprolactone or a derivative thereof is used as said dissolved thermoplastic polymer.

2. The light-curable composition according to claim 1, wherein said polycaprolactone or said derivative thereof has a number average molecular weight of at least 25,000 g/mol or at least 50,000 g/mol.

3. The light-curable composition according to claim 2, wherein said polycaprolactone or said derivative thereof has a number average molecular weight $M_n$ of at least 70,000 g/mol.

4. The light-curable composition according to claim 1, wherein said polycaprolactone or said derivative thereof is dissolved in said photopolymerizable matrix material at an amount of 2 to 30 wt %, based on 100 wt % of said matrix and said thermoplastic polymer taken together.

5. The light-curable composition according to claim 4, wherein said polycaprolactone or said derivative thereof is dissolved in said photopolymerizable matrix material at an amount of 5 to 15 wt %, based on 100 wt % of said matrix and said thermoplastic polymer taken together.

6. The light-curable composition according to claim 5, wherein said polycaprolactone or said derivative thereof is dissolved in said photopolymerizable matrix material at an amount of 10 wt %, based on 100 wt % of said matrix and said thermoplastic polymer taken together.

7. The light-curable composition according to claim 1, wherein polycaprolactone is used as said dissolved thermoplastic polymer.

8. The light-curable composition according to claim 1, wherein said photopolymerizable matrix material comprises at least one monofunctional reactive diluent and at least one di- or higher functional crosslinker.

9. The light-curable composition according to claim 8, wherein one or more (meth)acrylates is/are used as said reactive diluent and/or crosslinker.

10. The light-curable composition according to claim 8, wherein said at least one reactive diluent accounts for 30 to 80 wt % and said at least one crosslinker accounts for 70 to 20 wt % of said polymerizable matrix material.

11. The light-curable composition according to claim 8, wherein said at least one reactive diluent has a viscosity at 20° C. of not more than 0.1 Pa·s.

12. The light-curable composition according to claim 8, wherein an oligomer having a number average molecular weight $M_n$ of at least 400 g/mol is used as said crosslinker.

13. The light-curable composition according to claim 1, wherein the composition has a viscosity at 20° C. of at least 50 Pa·s.

14. The light-curable composition according to claim 13, wherein the composition has a viscosity at 20° C. of at least 80 Pa·s.

15. The light-curable composition according to claim 1, wherein the light-curable composition comprises at least one further component selected from the group consisting of thermal initiators, dyes, fillers, and modifiers.

16. The light-curable composition according to claim 8, wherein an oligomer having a number average molecular weight $M_n$ of at least 1,000 g/mol is used as said crosslinker.

17. The light-curable composition according to claim 8, wherein an oligomer having a number average molecular weight $M_n$ of at least 5,000 g/mol is used as said crosslinker.

18. The light-curable composition according to claim 8, wherein an oligomer having a number average molecular weight $M_n$ of at least 10,000 g/mol is used as said crosslinker.

* * * * *